(12) United States Patent
Wunderlich et al.

(10) Patent No.: US 7,893,426 B2
(45) Date of Patent: Feb. 22, 2011

(54) SINGLE-CHARGE TUNNELLING DEVICE

(75) Inventors: Jörg Wunderlich, Cambridge (GB); David Williams, Cambridge (GB); Tomas Jungwirth, Praha (CZ); Andrew Irvine, Swavesey (GB); Bryan Gallagher, Clifton Village (GB)

(73) Assignee: Hitachi Limited, Tokyo (JP)

( * ) Notice: Subject to any disclaimer, the term of this patent is extended or adjusted under 35 U.S.C. 154(b) by 39 days.

(21) Appl. No.: 11/500,992

(22) Filed: Aug. 9, 2006

(65) Prior Publication Data

US 2007/0200156 A1   Aug. 30, 2007

(30) Foreign Application Priority Data

Feb. 24, 2006   (EP)   .................................. 06110428

(51) Int. Cl.
   *H01L 29/06* (2006.01)
(52) U.S. Cl. ............................. 257/25; 257/24; 257/39; 257/E29.069; 257/E29.192; 438/3; 438/17
(58) Field of Classification Search .................... 257/24, 257/25, 30, 39, E29.068, E29.192; 438/3, 438/17
   See application file for complete search history.

(56) References Cited

U.S. PATENT DOCUMENTS

| | | | | |
|---|---|---|---|---|
| 4,858,036 | A * | 8/1989 | Ginkel | 360/60 |
| 5,432,373 | A * | 7/1995 | Johnson | 257/421 |
| 6,317,300 | B1 * | 11/2001 | Sasaki et al. | 360/325 |
| 6,381,171 | B1 * | 4/2002 | Inomata et al. | 365/173 |
| 6,919,213 | B2 * | 7/2005 | Flatte et al. | 438/3 |
| 2001/0005302 | A1 | 6/2001 | Bernier et al. | |
| 2007/0082230 | A1 * | 4/2007 | Shi et al. | 428/811 |

FOREIGN PATENT DOCUMENTS

| | | | |
|---|---|---|---|
| EP | 0 674 798 B1 | 5/1999 | |
| EP | 1 052 520 A1 | 11/2000 | |
| EP | 1 388 898 A1 | 2/2004 | |
| JP | 2001093274 A | * | 4/2001 |
| WO | WO 02/19435 A1 | 3/2002 | |
| WO | WO 2005/109454 A1 | 11/2005 | |

OTHER PUBLICATIONS

S. J. Pearton, et al; "Advances in Wide Bandgap Materials for Semiconductor Spintronics", Materials Science and Engineering R: Reports, Elsevier Sequoia S.A., Lausanne, CH, vol. 40, No. 4, Feb. 28, 2003, pp. 137-168 XP004410728.

S. Sugahara, "Spin Metal-Oxide-Semiconductor Field-Effect Transistors (Spin MOSFETs) for Integrated Spin Electronics", IEE Proceedings: Circuits Devices and Systems, Institution of Electrical Engineers, Stenvenage, G.B., vol. 152, No. 4, Aug. 5, 2005, pp. 355-365, XP006024923 ISSN: 1350-2409.

(Continued)

*Primary Examiner*—Thao X Le
*Assistant Examiner*—Robert Huber
(74) *Attorney, Agent, or Firm*—Antonelli, Terry, Stout & Kraus, LLP.

(57) ABSTRACT

A single-electron transistor (1) has an elongate conductive channel (2) and a side gate (3) formed in a 5 nm-thick layer (4) of $Ga_{0.98}Mn_{0.02}As$. The single-electron transistor (1) is operable, in a first mode, as a transistor and, in a second mode, as non-volatile memory.

25 Claims, 15 Drawing Sheets

OTHER PUBLICATIONS

K. Matsumoto, et al; "Room Temperature Operation of a Single Electron Transistor Made by the Scanning Tunneling Microscope Nanooxidation Process for the $TiO_x/Ti$ System," Applied Physics Letters, vol. 68, pp. 34-36, Jan. 1, 1996.

Masumi Saitoh, et al; "Room-Temperature Demonstration of Low-Voltage and Tunable Static Memory Based on Negative Differential Conductance in Silicon Single-Electron Transistors," Applied Physics Letters, vol. 85, pp. 6233-6235, Dec. 20, 2004.

S. A. Wolf, et al; "Spintronics: A Spin-Based Electronics Vision for the Future", Science, vol. 294, pp. 1488-1495 (Nov. 16, 2001).

K. Ono, et al; "Enhanced Magnetic Valve Effect and Magneto-Coulomb Oscillations in Ferromagnetic Single Electron Transistor," Journal of the Physical Society of Japan, vol. 66, No. 5, pp. 1261-1264, May 1997.

R. P. Campion, et al; "High-Quality GaMnAs Films Grown with Arsenic Dimers," Journal of Crystal Growth, vol. 247, p. 42-48, (2003).

* cited by examiner

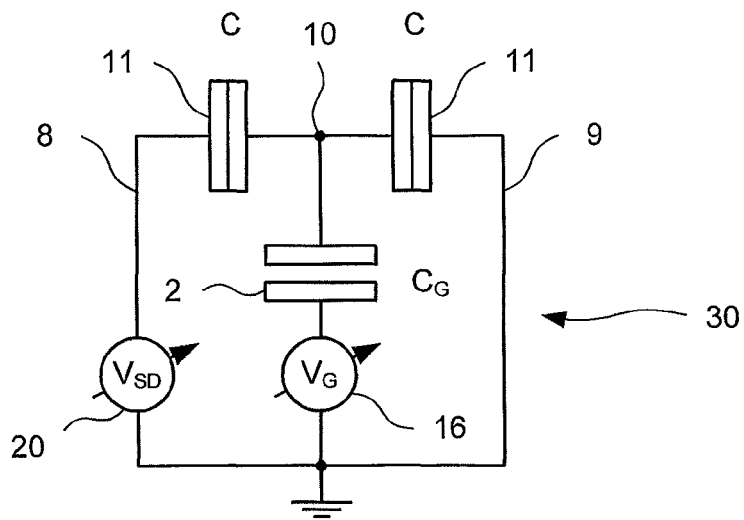
Fig. 8
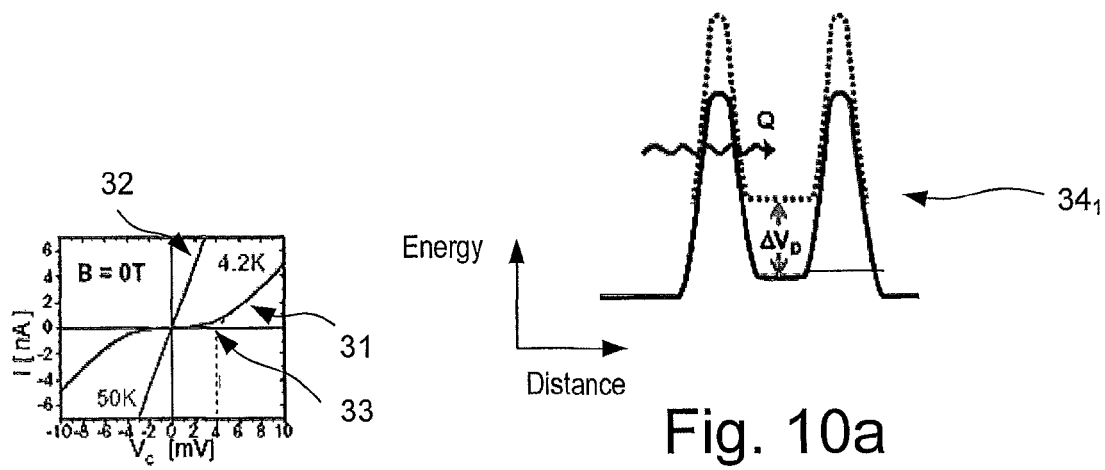
Fig. 9
Fig. 10a
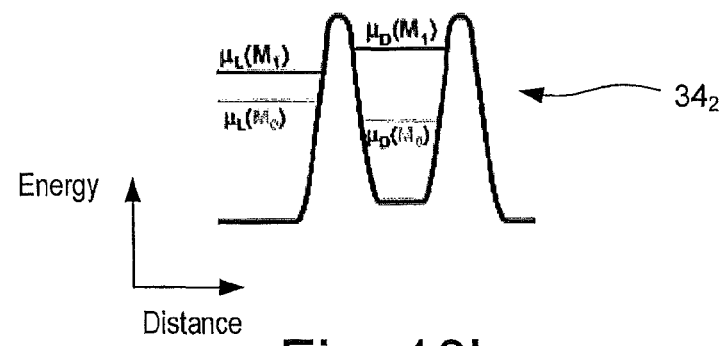
Fig. 10b

SINGLE-CHARGE TUNNELLING DEVICE

BACKGROUND OF THE INVENTION

Field of the Invention

The present invention relates to a single-charge tunnelling device.

Single-charge tunnelling devices, such as single-electron transistors (SETs) and single-electron turnstiles, are well known in the art.

In single-electron transistors, transfer of an electron from a source lead to a drain lead via a small, weakly-coupled island is inhibited by Coulomb blockade due to the charging energy, $E_C$, of the island. The charging energy $E_C = e^2/2C_\Sigma$, where $C_\Sigma$ is the total capacitance of the island. Applying a voltage $V_G$ to a gate electrode changes the electrostatic energy of the island to $Q^2/2C_\Sigma + QC_G V_G/C_\Sigma$ which is minimized when the charge on the island $Q = ne$ equals $-C_G V_G \equiv Q_0$. By tuning the continuous external variable $Q_0$ to $-(n+\frac{1}{2})e$, the charging energy associated with increasing the number of electrons on the island from n to n+1 vanishes and electrical current can flow between the leads. Changing the gate voltage then leads to oscillations in the source-drain current where each period corresponds to increasing or decreasing the charge state of the island by one electron.

Single-electron transistors are known which can operate at room temperature.

For example, "Room temperature operation of a single electron transistor made by the scanning tunneling microscope nanooxidation process for the $TiO_x$/Ti system" by K. Matsumoto, M. Ishii, K. Segawa, Y. Oka, B. J. Vartanian and J. S. Harris Applied Physics Letters, vol. 68, p 34 (1996), which describes a metallic SET fabricated by a scanning tunneling microscope nanooxidation process.

"Room-Temperature Demonstration of Low-Voltage and Tunable Static Memory Based on Negative Differential Conductance in Silicon Single-Electron Transistors" by M. Saitoh, H. Harata and T. Hiramoto, Applied Physics Letters, vol. 85, p 6233 (2004) discloses a single-hole transistor (SHT) in the form of an ultranarrow wire channel metal-oxide-semiconductor field-effect transistor (MOSFET).

Charge carrier transport can be controlled using other, different mechanisms.

For example, devices are known in which carrier transport is controlled, at least in part, by charge carrier spin. Well-known examples of these so-called "spintronic" devices include spin valves, based on the giant magnetoresistive effect (GMR), and magnetic tunnel junction (MTJ) devices. Generally, these devices comprise alternating layers of ferromagnetic and non-ferromagnetic material, the non-ferromagnetic material being metallic (in the case of a spin-valve) or insulating (in the case of MTJ device). Spintronic devices have several applications, including magnetic field sensors and magnetic random access memory (MRAM). A review of spin-based electronics and applications is given "Spintronics: A Spin-based Electronics Vision for the Future" by S. A. Wolf et al., Science, volume 294, pp. 1488 to 1495 (2001).

Attempts have been made to make single-electron transistors which also exhibit magnetoresistance effects.

For example, "Enhanced Magnetic Valve Effect and Magneto-Coulomb Oscillations in Ferro Magnetic Single Electron Transistor" by K. Ono, H. Shimada and Y. Ootuka, Journal of the Physical Society of Japan, vol. 66, No. 5, pp. 1261-1264 (1997) describes a single-electron transistor exhibiting Coulomb blockade oscillations induced by Zeeman coupling of electron spins to an external magnetic field. These magneto Coulomb blockade oscillations require application of magnetic fields of the order of a Tesla and do not lead to a non-volatile memory effect.

A low-field hysteretic magnetoresistance (MR) effect has been demonstrated in single-electron transistors where the relative magnetic configurations of the leads are switched from parallel to antiparallel. The sensitivity of the magnetoresistance to the gate voltage was attributed to resonant tunnelling effects through quantized energy levels in the island. Since in this case the magnetic field induced magnetization reorientation causes no shift in $Q_0$ the effect of the magnetic field is more subtle than that of the gate voltage, and variations in the source-drain current due to the magnetic field are much weaker than the gate-voltage induced Coulomb blockade oscillations The present invention seeks to provide an improved single-charge tunnelling device, for example which can also be used as a memory device.

SUMMARY OF THE INVENTION

According to a first aspect of the present invention there is provided a single-charge tunnelling device comprising first and second leads and a conductive island arranged such that charge is transferable from the first lead to the second lead via the conductive island, a gate for changing an electrostatic energy of the conductive island, wherein at least one of the first lead, second lead, island and gate comprises a ferromagnetic material which exhibits a change in chemical potential in response to a change in direction of magnetisation.

The first lead, the second lead and the island, and optionally the gate, may each comprise the same ferromagnetic material. The first lead, the second lead and the island, and optionally the gate, may be formed in a layer of the ferromagnetic material. The layer may have a constriction and the conductive island may be formed within the constriction.

Shapes of the first lead, the second lead and the island may be arranged such that magnetization of at least one of the first lead, second lead and island is forced along a direction transverse to magnetization of others of the first lead, second lead and island or is forced along a different direction from the other direction for which the chemical potentials are different.

The device may comprise at least two islands arranged such that charge is transferable from the first lead to the second lead via at least one of the at least two conductive islands.

The conductive island may have a charging energy and the change in direction of magnetization may causes a change in chemical potential of at least of the order of the charging energy.

At least two of the first lead, second lead and island may comprise a ferromagnetic material and there may be a net change in chemical potential in response to a change in direction of magnetization of at least one of the at least two of the first lead, second lead and island.

The change in chemical potential may be at least 1 meV, at least 6 meV or at least 9 meV.

The ferromagnetic material may be GaMnAs, such as $Ga_{0.98}Mn_{0.02}As$.

The ferromagnetic material may comprise an alloy including a rare earth metal, such as Dy, Er or Ho. The ferromagnetic material may comprise an alloy including a noble metal The ferromagnetic material may comprise FePt, CoPt or CoPd.

According to a second aspect of the present invention there is provided a single-charge tunnelling device comprising first and second leads and a conductive island arranged such that charge is transferable from the first lead to the second lead via the conductive island, wherein at least one of the first lead, second lead and island comprises a ferromagnetic material which exhibits a change in chemical potential in response to a change in direction of magnetisation.

According to a third aspect of the present invention there is provided a non-volatile memory comprising the single-charge tunnelling device.

According to a fourth aspect of the present invention there is provided a magnetic field sensor comprising the single-charge tunnelling device.

According to a fifth aspect of the present invention there is provided a method of operating the single-charge tunnelling device, the method comprising applying a first bias to the gate, removing the first bias from the gate, measuring a first resistance between the leads, applying a second, different bias to the gate, removing the second bias from the gate, measuring a second resistance between the leads, such that the first and second resistances differ.

According to a sixth aspect of the present invention there is provided a method of operating the single-charge tunnelling device, the method comprising applying a first magnetic field, removing the first magnetic field, measuring a first resistance between the leads, applying a second, different magnetic field, removing the second magnetic field, measuring a second resistance between the leads; such that the first and second resistances differ.

BRIEF DESCRIPTION OF THE DRAWINGS

Embodiments of the present invention will now be described, by way of example, with reference to the accompanying drawings in which:

FIG. 8 shows a circuit model for a single-electron transistor;

FIG. 9 illustrates current-voltage plots for the single-electron transistor shown in FIG. 1;

Referring to FIGS. 10a and 10b show contributions to Gibbs energy associated with the transfer of charge from a lead to an island of a single-electron transistor;

DETAILED DESCRIPTION OF THE EMBODIMENTS

Device Structure

Figure 1:
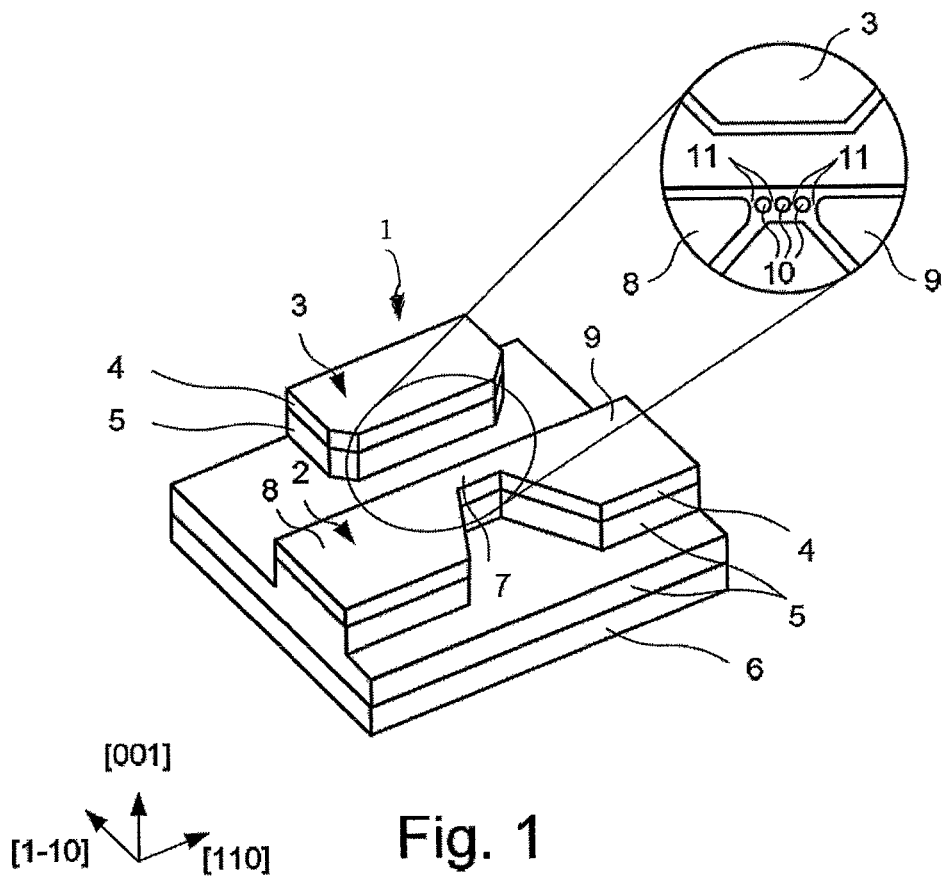
FIG. 1 is perspective schematic view of a single-electron transistor in accordance with certain embodiments of the present invention.
Figure 2:
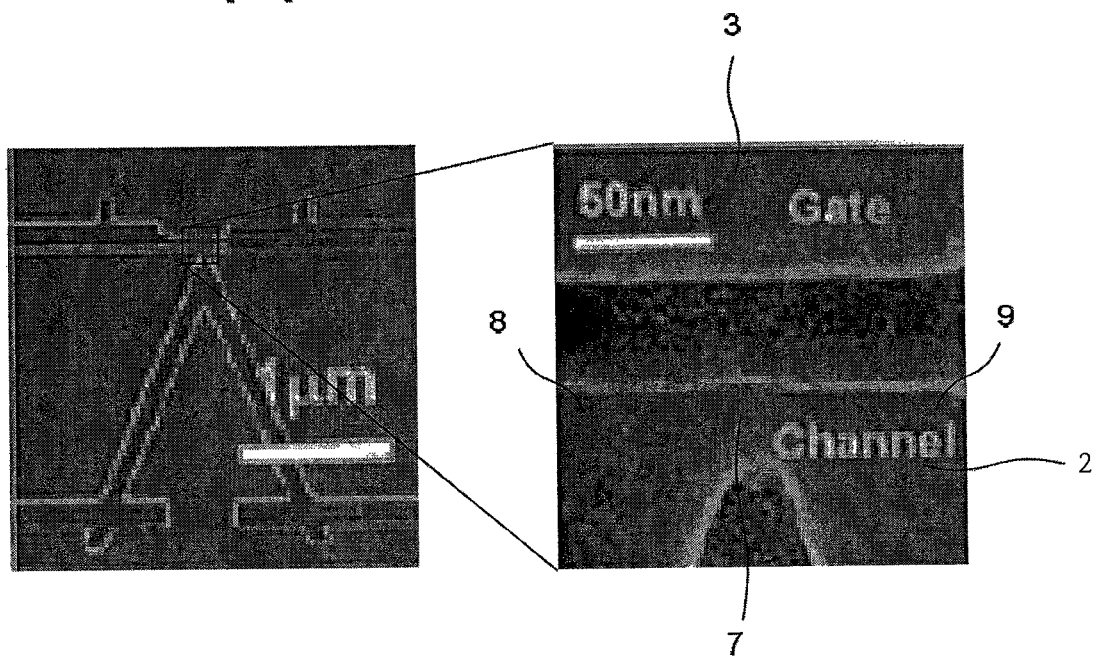
FIG. 2 shows electron-beam micrographs of the single-electron transistor shown in FIG. 1.

Referring to FIGS. 1 and 2, a single-electron transistor 1 in accordance with certain embodiments of the present invention has an elongated conductive channel 2 and a side gate 3 formed in a patterned layer 4 of (Ga,Mn)As by trench-isolation. A layer 5 of AlAs electrically isolates the channel 2 and the side gate 3 from a GaAs substrate 6. The channel 2 includes a constriction 7 disposed between wider portions which provide electrical leads 8, 9 to the constriction 7.

The (Ga,Mn)As layer 4 comprises 2% Mn, i.e. $Ga_{0.98}Mn_{0.02}As$, and has a thickness of 5 nm. The constriction 7 is 30 nm wide and 30 nm long. The channel 2 is 2 μm wide. The channel 2 and the gate 3 are separated by about 30 nm.

In the region of the constriction 7, potential fluctuations arising from disorder create at least one conductive island 10 and at least a pair of tunnel barriers 11 which weakly couple the island 10 to leads 8, 9 and/or adjacent islands 10.

As will be explained in more detail later, the single-electron transistor 1 is operable, in a first mode, as a transistor and, in a second mode, as non-volatile memory. However, before describing operation of the single-electron transistor 1, the magnetoresistance characteristics of a test structure 13 (FIG. 3) will first be described and compared with the magnetoresistance characteristics of the single-electron transistor 1.

Magnetoresistance Characteristics

Figure 3:
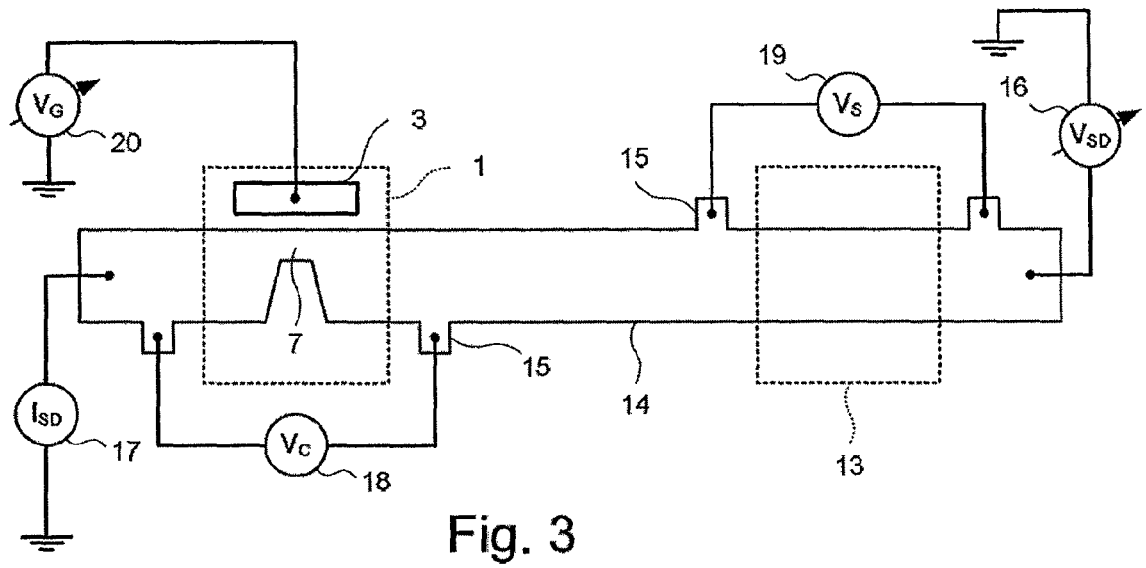
FIG. 3 is a schematic plan view of a Hall bar including the single-electron transistor 1 shown in FIG. 1 and a test structure.

Referring to FIG. 3, the single-electron transistor 1 and a test structure 13 share an elongate Hall bar 14 formed in the patterned (Ga,Mn)As layer 4 and has pairs of terminals 15 spaced at 10 μm intervals either side of the constriction 7. The longitudinal axis of the bar 14 is arranged along the direction.

A voltage source 16 is arranged to provide a source-drain bias \hp between ends of the bar 14. A current meter 17 is arranged to measure a source-drain current I through the bar 14. A first voltage meter 18 is configured to measure a potential difference $V_C$ across the constriction 7 and a second voltage meter 19 is arranged to measure a potential difference $V_S$ across the test structure 13. This arrangement allows the characteristics of the single-electron transistor 1 and the test structure 13 to be compared. A second voltage source 20 is arranged to apply a bias $V_G$ to the gate 3 (with respect to ground).

A chip (not shown) on which the Hall bar 14 is fabricated is mounted on an insert (not shown) and placed in a cryostat (not shown) having a superconducting coil (not shown) and power supply (not shown) for applying a magnetic field (not shown). The insert includes connecting wires (not shown) for connecting the control and measurement system 16, 17, 18, 19, 20 outside the cryostat to the single-electron transistor 1 and test structure 13 within the cryostat.

The insert (not shown) has a tiltable support (not shown) on which the chip is mounted which allows the chip to be tilted with respect to the magnetic field. Thus, the magnetic field can be aligned parallel with or perpendicular to current flow I in the Hall bar 14.

—Magnetoresistance Characteristics for Test Structure 13—

Figure 4:
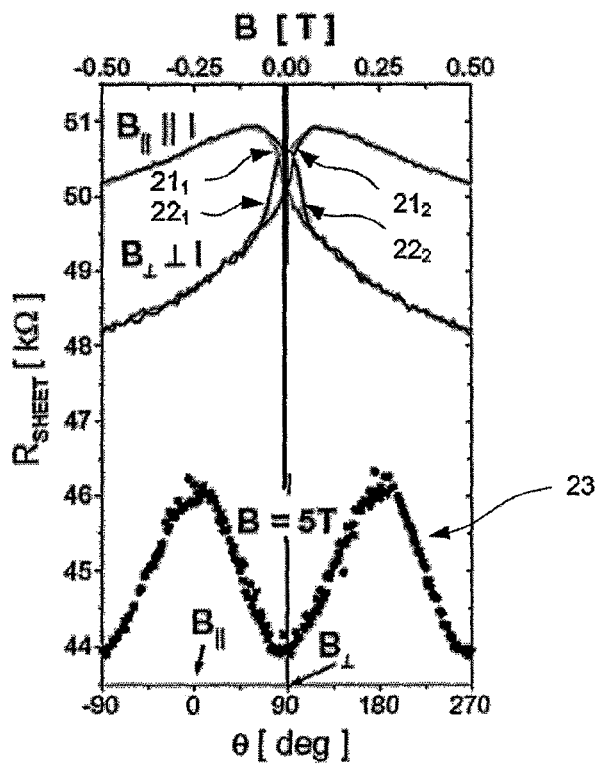
FIG. 4 shows plots of resistance against magnetic field for the test structure shown in FIG. 3.

Referring to FIG. 4, plots $21_1$, $21_2$, $22_1$, $22_2$, 23 of resistance $R_S$ (=$V_S$/I) of the test structure 13 at $V_{SD}$=5 mV and temperature of 4.2° K are shown.

First and second plots $21_1$, $21_2$ show how resistance $R_S$ varies as a function of magnetic field magnitude for a parallel magnetic field (i.e. B∥I) as the field is increased and decreased respectively. Third and fourth plots $22_1$, $22_2$ show how resistance $R_S$ varies as a function of magnetic field magnitude for a perpendicular magnetic field (i.e. B∥I) as the field is increased and decreased respectively. Finally, fifth plot 23 shows resistance $R_S$ as a function of magnetic field orientation for a fixed, large magnetic field of 5 Tesla. Here, angle θ=90° corresponds to B∥I (and also to M∥I at large fields).

The test structure 13 exhibits a high resistance state when magnetization is aligned with current I in the structure 13 and a low resistance state when magnetization is aligned perpendicular to current in the structure 13.

—Magnetoresistance Characteristics for Single-Electron Transistor 1—

Figure 5:
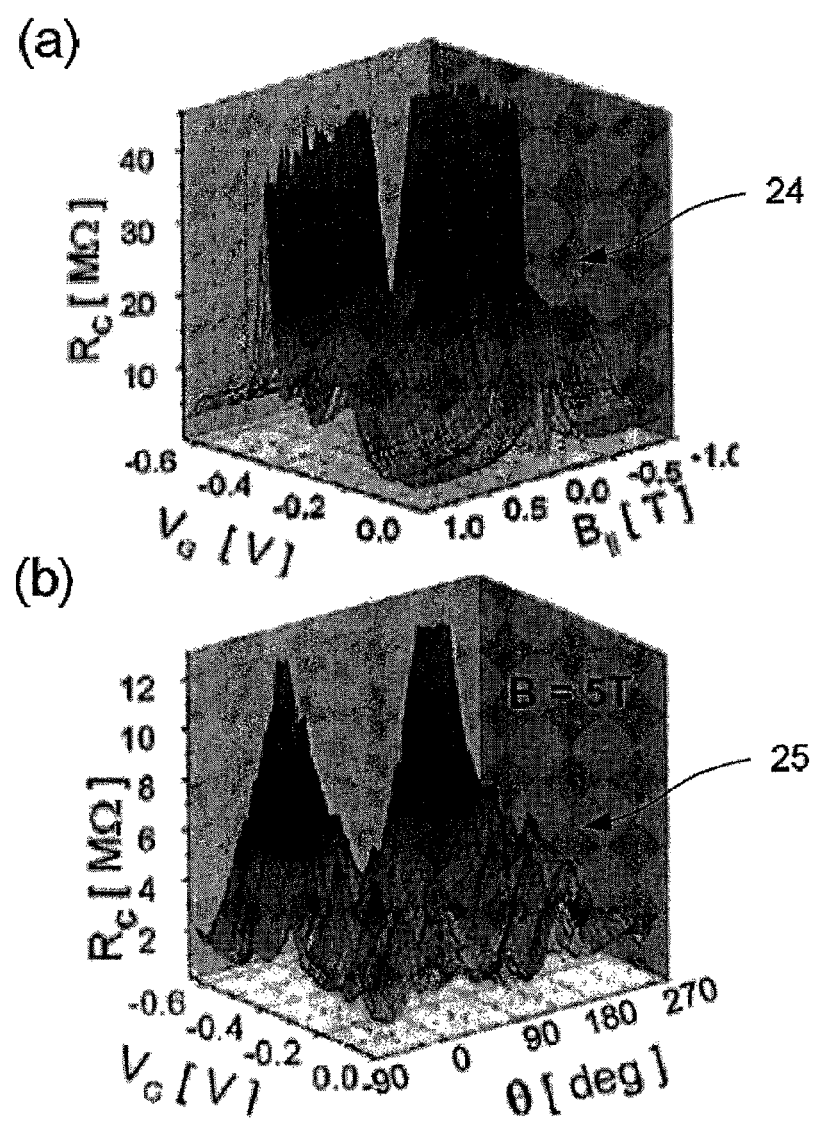
FIGS. 5a and 5b show plots of resistance against magnetic field for the single-electron transistor shown in FIG. 1.

Referring to FIGS. 5a and 5b, plots 24, 25 of resistance $R_C$ (=$V_C$/I) of the constriction 7 of the single-electron transistor 1 at $V_{SD}$=5 mV and 4.2° K are shown.

In FIG. 5a, the plot 24 shows how resistance $R_C$ varies with gate voltage $V_G$ and also with magnetic field strength when the field is aligned parallel with current flow (i.e. B∥I). In FIG. 5b, the plot 25 shows how resistance $R_C$ varies with gate voltage $V_G$ and also orientation of magnetic field for a fixed, large magnetic field of 5 Tesla.

Similar to the test structure 13, the single-electron transistor 1 also shows high and low resistance states depending on whether magnetic field is aligned parallel with or perpendicular to current flow, i.e. anisotropic magnetoresistance (AMR) effect.

However, in the single-electron transistor 1, the anisotropic magnetoresistance not only depends on gate voltage $V_G$, but also is greatly enhanced as seen, for example, at $V_G$=0.5 V. As will be explained in more detail later, this effect (herein referred to as the "Coulomb blockade anisotropic magneto resistance effect" or "CBAMR effect") can be used to provide non-volatile memory functionality.

Figure 6:
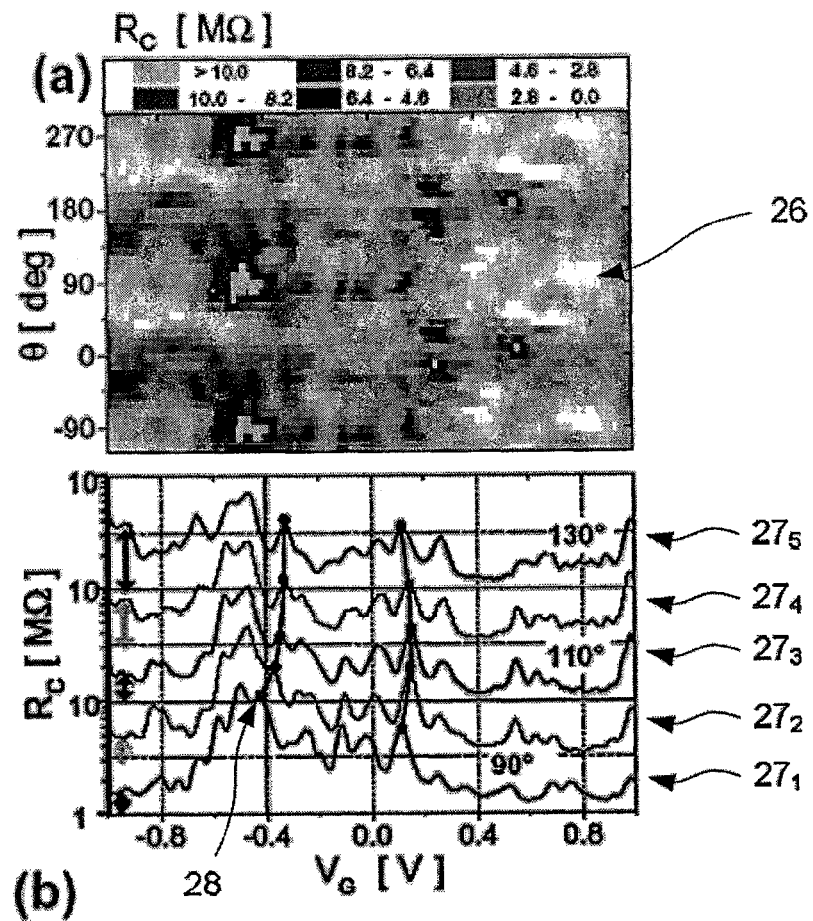
FIGS. 6a and 6b show plots of resistance against magnetic field orientation for different gate voltages for the single-electron transistor shown in FIG. 1.

Referring to FIGS. 6a and 6b, plots 26, $27_1$, $27_2$, $27_3$, $27_4$, $27_5$ of resistance $R_C$ of the constriction 7 of the single-electron transistor 1 for different gate voltages $V_G$ and orientations of magnetic field, at $V_{SD}$=5 mV and 4.2° K are shown.

The single-electron transistor 1 exhibits shifts in the Coulomb blockade oscillation pattern caused by changes in magnetization orientation. For example, the oscillations have a peak 28 at $V_G$=−0.4 V for θ=90° which moves to higher gate voltages with increasing θ and, for θ=130°, the $V_G$=−0.4V state becomes a minimum in the oscillatory resistance pattern.

Figure 7:
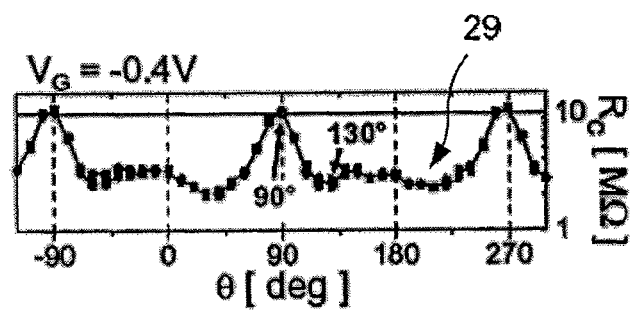
FIG. 7 shows a plot of resistance against magnetic field orientation for the single-electron transistor shown in FIG. 1.

Referring also to FIG. 7, a plot 29 of resistance $R_C$ of the constriction for the single-electron transistor 1 for different orientations of magnetic field at $V_G$=−0.4 V and 4.2° K is shown.

Comparing the first plot $27_1$ shown in FIG. 6b with the plot 29 shown in FIG. 7, changes in the magnitude of resistance $R_C$ arising from changes in gate voltage $V_G$ are comparable to those arising from changes in magnetic field orientation.

—Single-Electron Transistor 1 Gate and Tunnel Barrier Parameters—

Before explaining the behaviour of the single-electron transistor 1 in detail, gate and tunnel barrier parameters for the single-electron transistor 1 can be estimated.

Referring to FIG. 8, a circuit model 30 for a single-electron transistor is shown. An island has a total capacitance $C_\Sigma$=2C+ $C_G$ which defines the Coulomb blockade charging energy $e^2/2C_\Sigma$.

Referring to FIG. 9, current-voltage plots 31, 32 for the single-electron transistor 1 at 4.2° K and 50° K are shown. The first plot 31 shows the single-electron transistor 1 in a Coulomb blockade regime. The second plot 32 shows the single-electron transistor 1 in an ohmic-conduction regime. From the current-voltage plot 31 at 4.2° K, the charging energy $e^2/2C_E$ can be estimated to be of the order of a few meV from a position 33 at which current flows. The position 33 does not change if the transistor 1 is cooled to lower temperatures.

Referring again to FIG. 6b, from any one of the resistance-gate voltage plots $27_1$, $27_2$, $27_3$, $27_4$, $27_5$ the period of the Coulomb blockade oscillations $e/C_G$ is of the order of ~100 mV.

Using the characteristics shown in FIGS. 6b and 9, values of $C_\Sigma$, $C_G$ and C can be estimated. This shows that the lead-island capacitance C is approximately 100 times larger than the gate capacitance $C_G$. This is consistent with the geometry, dimensions and materials of the single-electron transistor 1, namely the gate 2 and constriction 7 being separated by 30 nm and the dielectric constant of the tunnel barriers having a value of 12.85, i.e. using a value for GaAs.

—Coulomb Blockade Anisotropic Magnetoresistance (CBAMR) Effect—

The following is provided by way of an explanation of the behavior of the single-electron transistor 1.

As explained earlier, the single-electron transistor 1 exhibits an enhanced anisotropic magnetoresistance (AMR) effect.

The microscopic origin of this effect is considered to occur due to anisotropies in chemical potential μ arising from the spin-orbit coupled band structure of (Ga,Mn)As.

Referring to FIG. 10, first and second energy diagrams $34_1$, $34_2$ show contributions to the Gibbs energy U associated with the transfer of charge Q from the lead 8 to the island 10.

The Gibbs energy U can be expressed as the sum of the internal, electrostatic charging energy term and the term associated with, in general, different chemical potentials of the lead 8 and of the island 10, namely:

$$U = \int_0^Q dQ' \Delta V_D(Q') + Q\Delta\mu/e \qquad (1)$$

where $\Delta V_D(Q) = (Q + C_G V_G)/C_\Sigma$.

The carrier concentration is non-uniform, which suggests that the difference Δμ between chemical potentials of the lead 8 and of the island 10 in the constriction 7 depends on the magnetization orientation. The difference Δμ is considered to increase with decreasing doping density in (Ga,Mn)As.

The Gibbs energy U is minimized for $Q_0 = -C_G(V_G + V_M)$, where the magnetization orientation dependent shift of the Coulomb blockade oscillations is given by $V_M = C_\Sigma/C_G \Delta\mu (M)/e$. Since $|C_C V_M|$ has to be of order |e| to cause a marked shift in the oscillation pattern, the corresponding |Δμ(M)| has to be similar to $e^2/C_\Sigma$, i.e., of the order of the island single electron charging energy.

As shown earlier, the single electron charging energy is estimated to be of order of a few meV. Theoretical calculation (FIG. 11) confirms that chemical potential variation due to magnetization reorientation is also of the order few meV and therefore can cause CBAMR effect.

Unlike the ohmic or tunnelling anisotropic magnetoresistance, whose magnitude scales with the relative anisotropies in the group velocity (and scattering lifetimes) or the tunnelling density of states, the CBAMR effect occurs when the absolute magnitude of the change of the chemical potential is comparable to the single electron charging energy. When this occurs, magnetization rotation-induced variations in resistance are of the size of the SET Coulomb blockade oscillations.

Figure 11:
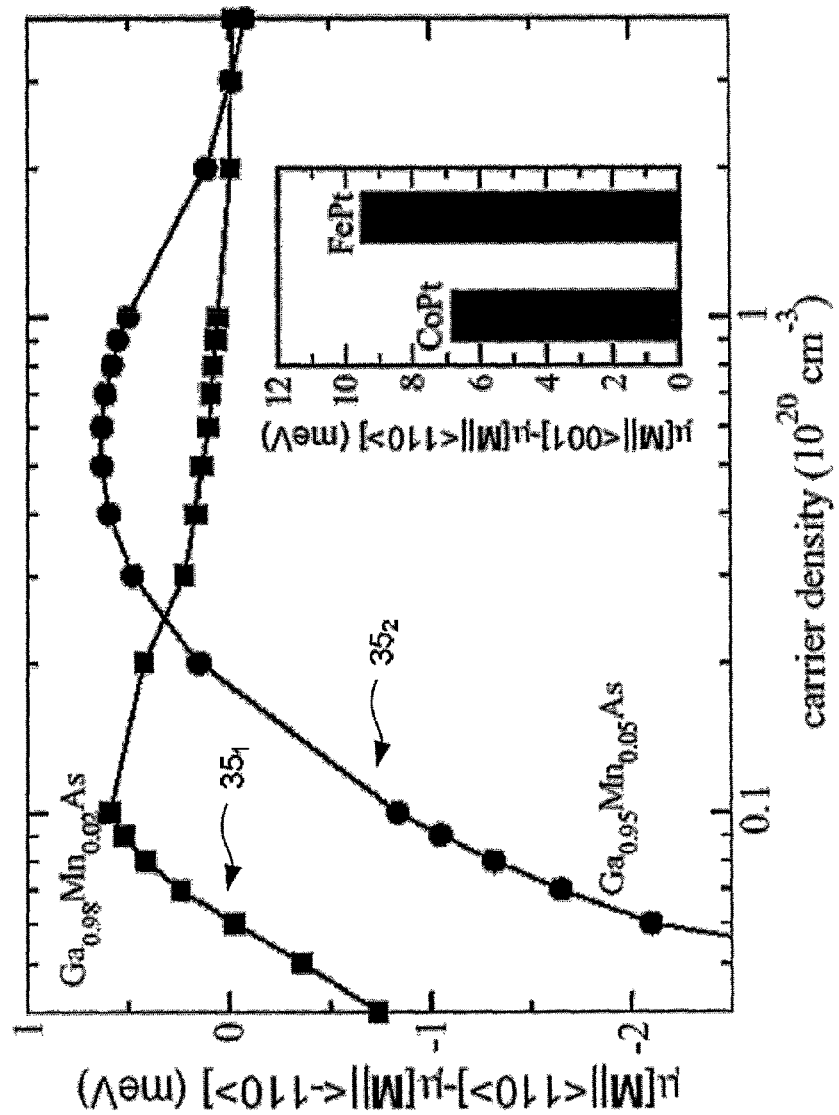
FIG. 11 shows plots of density-dependent chemical potentials with respect to uniaxial anisotropy modelled using a k.p kinetic-exchange model.

Although the single-electron transistor 1 described earlier is formed in a thin layer of (Ga,Mn)As, other ferromagnetic material exhibiting strong spin-orbit coupling may be used. For example, chemical potential variations due to magnetization rotations may reach 10 meV in a FePt ordered alloy (FIG. 11). Thus, the single-electron transistor may be formed in thin layers of a material comprising a transition metal and a noble metal may be used.

Furthermore, the CBAMR effect can occur whenever there is a difference in chemical potential anisotropies in different parts 2, 8, 9, 10 of the single-electron transistor 1. This can be arranged by fabricating the leads 8, 9, gate 2 and island 10 from the same ferromagnetic material, but with different shape anisotropies leading to different magnetization reorientation fields or by fabricating at least one of the leads 8, 9, gate 2 and island 10 from a different ferromagnetic material exhibiting strong spin-orbit coupling.

—Magnetic Anisotropy in Thin GaMnAs Films—

The (Ga,Mn)As layer 4 (FIG. 1) exhibits in-plane cubic anisotropy with <100> easy axes arising from compressive biaxial strain.

The (Ga,Mn)As layer 4 (FIG. 1) also exhibits a pronounced uniaxial anisotropy along one of the cubic hard axes <110> which strongly depends on the carrier density.

The uniaxial anisotropy can be explained in terms of the p-d Zener model of the ferromagnetism assuming a small trigonal-like distortion. Such a distortion may be associated with strains due to the etching of the lithographically defined transistor 1 or may result from a non-isotropic Mn distribution.

Thus, structures patterned from ultra-thin GaMnAs film exhibit a strong uniaxial anisotropy with easy axis along [1–10] direction which corresponds to the direction in plane and perpendicular to the bar 14.

FIG. 11 shows a plots $35_1$, $35_2$ of density-dependent chemical potentials with respect to uniaxial anisotropy modelled using a k.p kinetic-exchange model by assuming a small (0.1%) shear strain for $Ga_{0.98}Mn_{0.02}As$ and $Ga_{0.95}Mn_{0.05}As$. Although the model used does not allow the full anisotropy of the work function (chemical potential measured from the vacuum level) to be calculated, it nevertheless illustrates variations of the chemical potential of a few mV for in-plane magnetization rotation.

FIG. 11 also shows (in an inset) chemical potentials $36_1$, $36_2$ for CoPt and FePt. CoPt or FePt show larger chemical potential anisotropies and use of these alloys as a ferromagnetic material may allow devices in accordance with certain embodiments of the invention to exhibit CMAMR effect at higher temperatures.

—Single-Electron Transistor 1 Characteristics—

Figure 12:
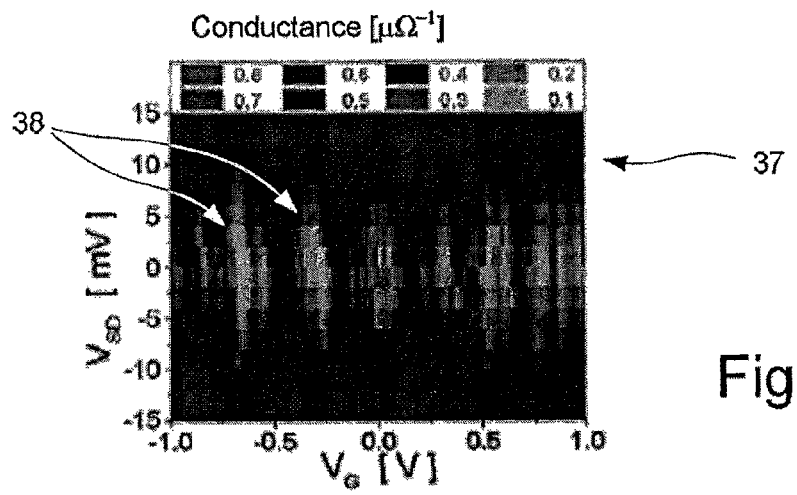
FIG. 12 shows a plot of Coulomb blockade conductance as a function of gate voltage for the single-electron transistor shown in FIG. 1.

Referring to FIG. 12, a plot 37 of Coulomb blockade conductance $I/V_C$ of the constriction 7 of the single-electron transistor 1 as a function of gate voltage $V_G$ at 4.2° K is shown. The plot 37 shows so-called "conductance diamonds" 38 arising from Coulomb blockade oscillations. The Coulomb blockade oscillations disappear at approximately 10° K.

Figure 13:
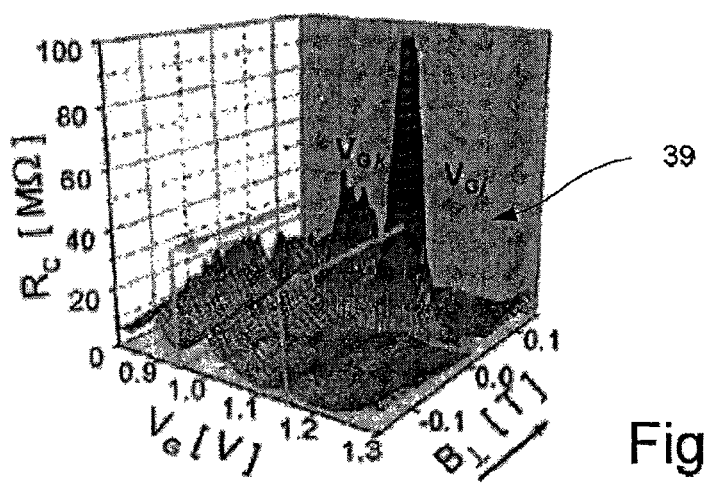
FIG. 13 shows a plot of resistance as a function of gate bias and magnetic field strength for the single-electron transistor shown in FIG. 1.

Referring to FIG. 13, a plot 39 of resistance $R_C (=V_C/I)$ of the constriction 7 of the single-electron transistor 1 as a function of gate bias $V_G$ and magnetic field strength at $V_{SD}$=3 mV and 4.2° K is shown. The magnetic field is applied in the plane of the (Ga,Mn)As layer 4, but perpendicular to the longitudinal direction of the bar 14 (FIG. 2) and channel 2 (FIG. 1). The single-electron transistor 1 exhibits high electro- and magneto-sensitivity.

Figure 14:
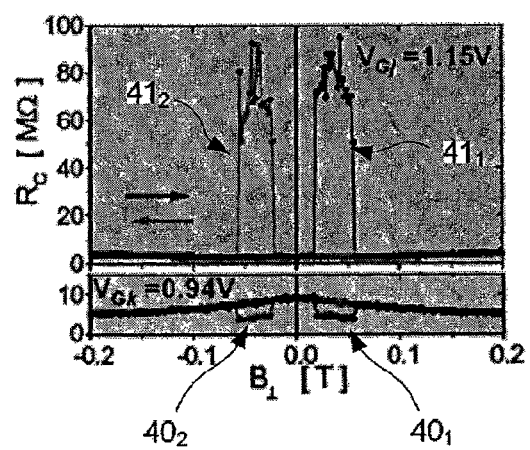
FIG. 14 shows plots of resistance against magnetic field for the single-electron transistor shown in FIG. 1.

Referring also to FIG. 14, which shows forward and reverse sweep plots $40_1$, $40_2$, $41_1$, $41_2$ of resistance $R_C (=V_C/I)$, the resistance of the constriction 7 drops by approximately 100% at $V_G$=0.94 V at B=20 mT and rises by more than 1000% at $V_G$=1.15 V. The resistance changes are associated with rotations of (Ga,Mn)As magnetization.

Device Fabrication

Figure 15A:
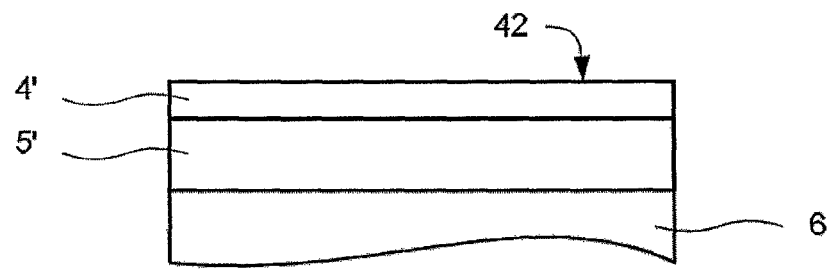
FIGS. 15a to 15c illustrate steps in a process of fabricating of the single-electron transistor shown in FIG. 1.
Figure 15B:
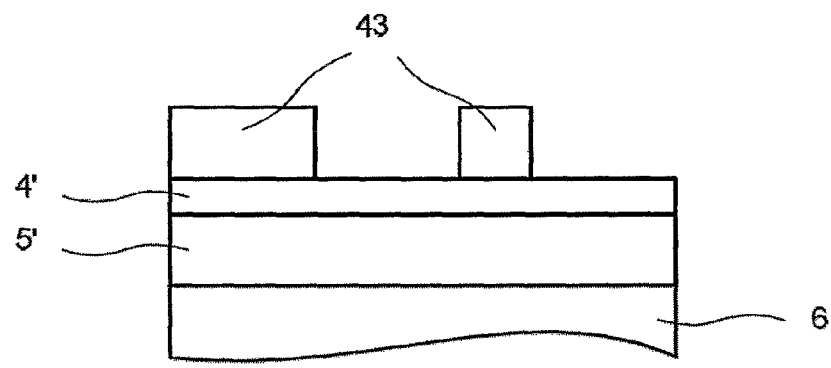
Figure 15C:
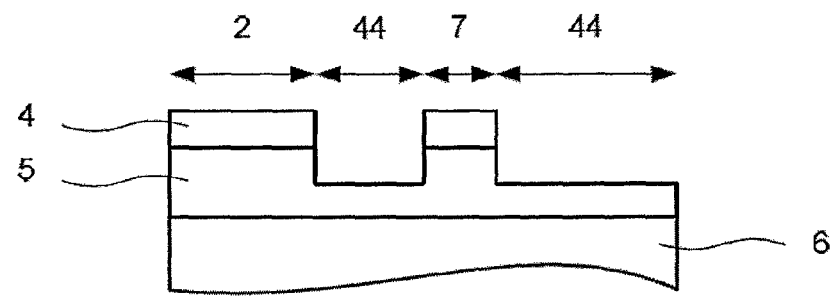

Referring to FIGS. 15a to 15c, fabrication of the Hall bar 14 (FIG. 3) including the single-electron transistor 1 will now be described.

Referring to FIG. 15a, the Hall bar 14 (FIG. 3) is fabricated from an ultra-thin (5 nm) $Ga_{0.98}Mn_{0.02}As$ epilayer 4' grown along the [001] crystal axis on a AlAs 5' buffer layer on a GaAs substrate 6 by low-temperature molecular beam epitaxy and reference is made to "High-quality GaMnAs films grown with arsenic dimers" by R. P. Campion, K. W. Edmonds, L. X. Zhao, K. Y. Wang, C. T. Foxon, B. L. Gallagher and C. R. Staddon, Journal of Crystal Growth, volume 247, p 42 (2003).

Due to the high reactivity of the GaMnAs layer to alkaline developers used in optical lithography, Hall bar 14 is defined using electron-beam lithography using a poly-methyl-methacrylate (PMMA) resist developed using ultrasound in a methyl isobutyl ketone/isopropanol 1:3 mixture at 25° C.

Thermally-evaporated, high-electron-contrast Cr/Au registration marks (not shown) having thicknesses of 20 nm and 60 nm respectively are patterned by lift-off using 1 μm-thick resist (not shown) and ~250 nm electron-beam diameter. A 30 s dip in 10% HCl solution is used prior to evaporation to assist adhesion of metal without unduly damaging the GaMnAs.

A ~200 nm-thick layer of resist (not shown) is applied to the surface 42 of the $Ga_{0.98}Mn_{0.02}As$ epilayer 4'. The finest features are defined using an electron-beam (not shown) having a ~15 nm beam diameter and ~5 pA current, with on-chip focusing at adjacent registration marks. Less-critical areas (not shown) are defined in the same resist by a ~250 nm beam at ~1 nA. The high-resolution regions are arranged to be as small as possible to minimise write time and pattern drift.

Referring to FIG. 15b, the resist is developed to leave a patterned resist layer 43 as an etch mask.

Referring to FIG. 15c, reactive-ion etching (RIE) is used for trench isolation. Any RIE-related conductivity impairment is expected to be minimal compared with the high conductivity of the GaMnAs. The pressure in the RIE chamber (not shown) is 20 mTorr, with 20 sccm flow of both $SiCl_4$ and Ar to provide the required mix of physical and chemical etch action suitable for removing both GaAs and manganese. A typical etch of 10-15 s at 100 W yielded a trench 44 having a depth of 20-30 nm, safely through the GaMnAs layer.

Cr/Au (20 nm/300 nm) bond pads are thermally evaporated, again preceded by an adhesion dip in HCl solution. The bond pads form a low-resistance electrical contact to the GaMnAs layer and no separate ohmic metallization is required.

In this example, devices are arranged in a Hall-bar layout aligned along [110] direction, with a 2 µm-wide channel and three pairs of Hall sensor terminals of 500 nm width at 10 µm intervals either side of the constriction. However, other arrangements can be used.

Device Operation

As explained earlier, the single-electron transistor 1 is sensitive to both electric and magnetic fields. Low-field hysteretic shifts in the Coulomb blockade oscillations can be induced in the transistor 1. Furthermore, the transistor 1 exhibits non-volatile memory effect with an "on" state resistance of order ~1 MΩ and an "off" state resistance of the order of ~10 MΩ (or higher).

In conventional, non-magnetic single-electron transistors, the Coulomb blockade "on" (low-resistance) and "off" (high-resistance) states are used to represent logical "1" and "0" and the switching between the two states can be realized by applying the gate voltage, similar to conventional field-effect transistors.

The single-electron transistor 1 can be addressed not only electrically as for a conventional, non-magnetic single-electron transistor, but also magnetically with comparable "on" to "off" resistance ratios in electric and magnetic modes.

Furthermore, magnetization can be re-orientated and, thus, the state of the device changed between "0" and "1" either magnetically or electrically, as shall now be described.

—Magnetic Field Induced Switching—

Figure 16:
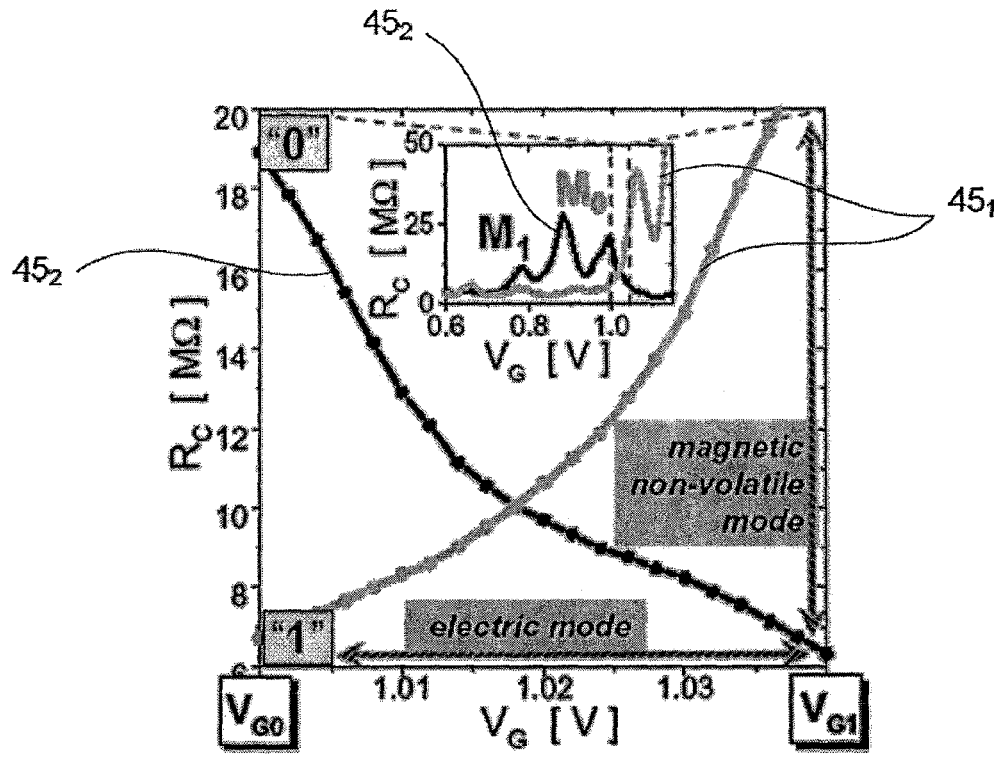
FIG. 16 shows Coulomb blockade oscillation curves for the single-electron transistor shown in FIG. 1.

Referring to FIG. 16, two Coulomb blockade oscillation curves 45₁, 45₂ are shown corresponding to magnetizations $M_0$ and $M_1$ of, in this case, one of the islands 10 (FIG. 1).

Figure 17:
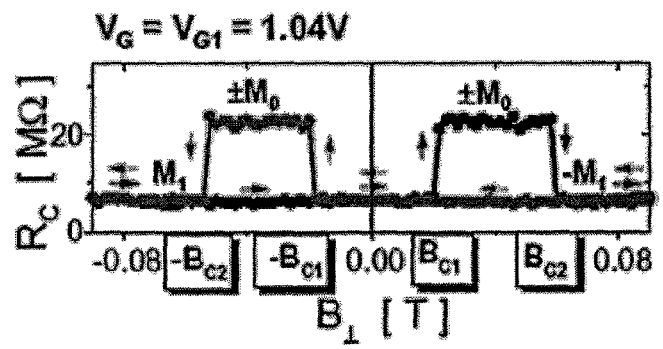
FIG. 17 show plots of resistance against magnetic field for the single-electron transistor shown in FIG. 1.

Referring also to FIG. 17, magnetization $M_0$ can be set by performing a small loop in the magnetic field, $B \rightarrow B_0 \rightarrow 0$ where $B_0$ is larger than the first switching field $B_{c1}$ and smaller than the second switching field $B_{c2}$ and magnetization $M_1$ can be achieved by performing the large filed-loop, $B \rightarrow B_1 \rightarrow 0$ where $B_1 < -B_{c2}$.

Assuming the system is in the $M_1$ state, the voltage $V_{G0}$ corresponds to "0" and $V_{G1}$ to "1" in the electric mode. Conversely, fixing the gate voltage at $V_{G1}$, the switching from "1" to "0" can be performed by changing the magnetic state from $M_1$ to $M_0$. Due to the hysteresis, the magnetic mode represents a non-volatile memory effect.

Electric Field Induced Switching

Referring again to FIG. 1, in the single-electron transistor 1, the gate 2 can be used to vary the carrier density. As explained earlier, uniaxial anisotropy can depend on, among other things, the carrier density. Therefore, the gate 2 can be used to control uniaxial anisotropy and, thus, whether uniaxial anisotropy or biaxial (or cubic) anisotropy dominates.

Figure 18:
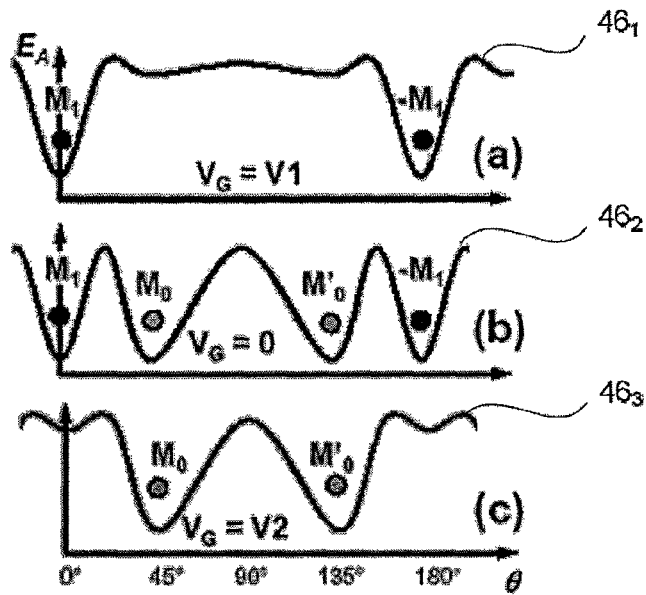
FIGS. 18a to 18c show illustrative potential distributions and stable magnetization states for different magnetisations angles.

FIGS. 18a to 18c show first, second and third illustrative potential distributions 46₁, 46₂, 46₃ and stable magnetization states $M_0$, $-M_0$, $M_1$, $-M_1$ for the island 10 at different magnetisations angles for three different gate voltages, namely $V_G=V1$, $V_G=0$ and $V_G=V2$ respectively. The angles θ=0°, 45°, 90°, 135° and 180° may correspond, for example to [1−10], [100], [110], [010], and [−110].

Referring to FIG. 18a, uniaxial anisotropy is maintained (or even amplified), while cubic anisotropy is suppressed, at $V_G=V1$, thereby favouring magnetization $M_1$.

Referring to FIG. 18b, the Mn doping concentration may be such that well-isolated energy minima for both uniaxial and cubic anisotropy exist at $V_G=0$.

Referring to FIG. 18c, cubic anisotropy dominates over the uniaxial anisotropy at $V_G=V2$, thereby favouring magnetization $M_0$.

Thus, applying either $V_G=V1$ or V2 causes a change in magnetisation. However, removing the applied $V_G$, the magnetisation remains.

Figure 19:
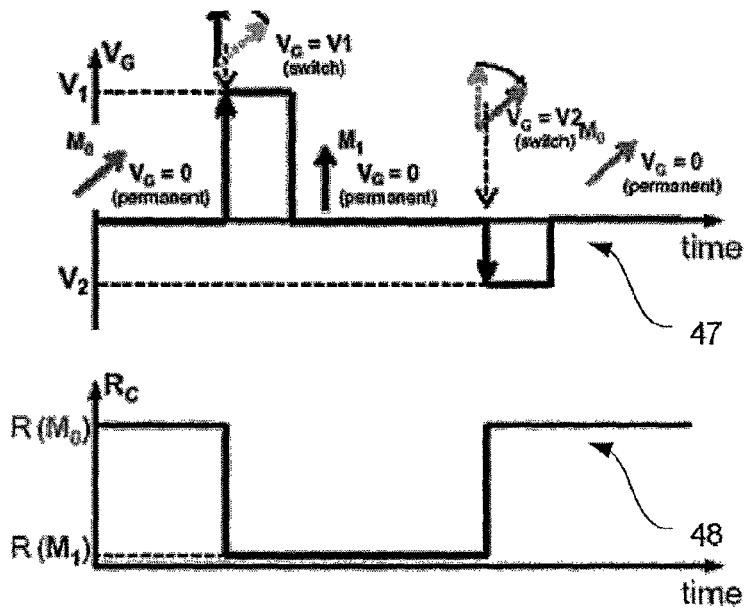
FIG. 19 illustrates electrical switching of states.

Referring to FIG. 19, plots 47, 48 show how changes in gate voltage $V_G$ result in a change of measurable resistance $R_C$ with time.

Figure 20:
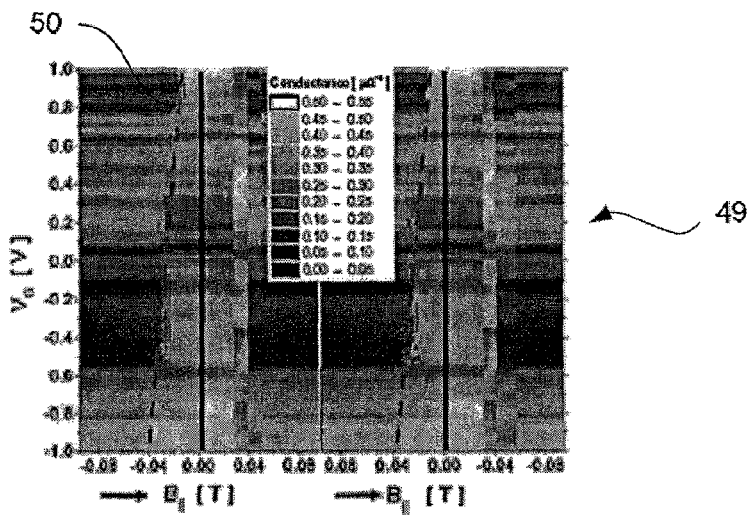
FIG. 20 is a greyscale plot of conductance as a function of magnetic field for the single-electron transistor shown in FIG. 1.

Referring to FIG. 20, a greyscale plot 49 of conductance $(=I/V_C)$ against gate voltage $V_G$ and against in-plane, parallel magnetic field strength at $V_{SD}=3$ mV and at 4.2 K is shown. The applied field orientation corresponds to one of the magnetic hard axes in this system. The dashed line 50 shows critical reorientation field which is strongly gate bias dependent.

Figure 21:
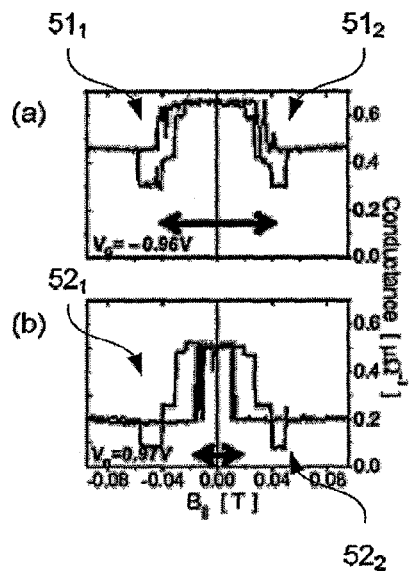
FIGS. 21a and 21b are conductance plots as a function of magnetic field for the single-electron transistor shown in FIG. 1.

Referring to FIGS. 21a and 21b, conductance plots 51₁, 51₂, 52₁, 52₂ at $V_G=-0.96V$ and at $V_G=0.97V$ are shown. The plots highlight a substantial decrease in the first critical reorientation field from about 0.04 T at $V_G=-0.96V$ to less than 0.02 T at $V_G=0.97$ V.

Figure 22:
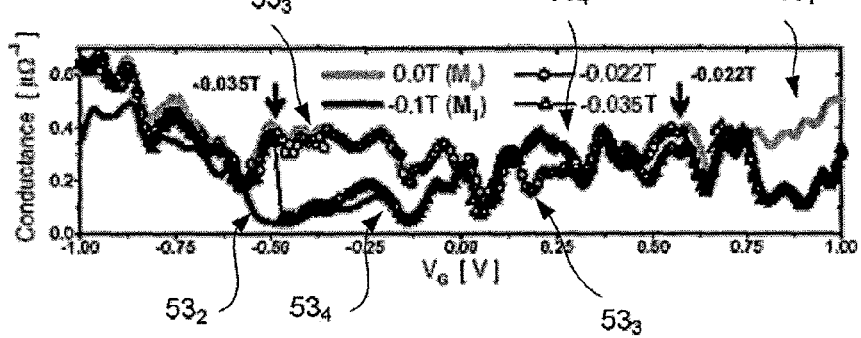
FIG. 22 show plots of conductance against gate bias for $B=0$ T, $B=-0.1$ T, $B=-0.022$ T and $B=-0.035$ T for the single-electron transistor shown in FIG. 1.

Referring FIG. 22, plots 53₁, 53₂, 53₃, 53₄ showing variation of conductance with gate bias for B=0 T, B=−0.1 T, B=−0.022 T and B=−0.035 T respectively are shown.

At B=0 T, the island 10 remains in magnetization state $M_0$ over the gate voltage range between $V_G=-1V$ to 1V. Likewise, at B=−0.1 T, the island 10 remains in magnetization state $M_1$ over the gate voltage range.

However, at intermediate field strengths B=−0.022 T and B=−0.035 T, the island 10 passes through a transition from $M_0$ to $M_1$ at critical gate voltages of about 0.6V and −0.5V respectively.

Thus, electric field assisted magnetization reorientations are observed at lower gate voltages compared with conventional field effect transistor.

Figure 23:
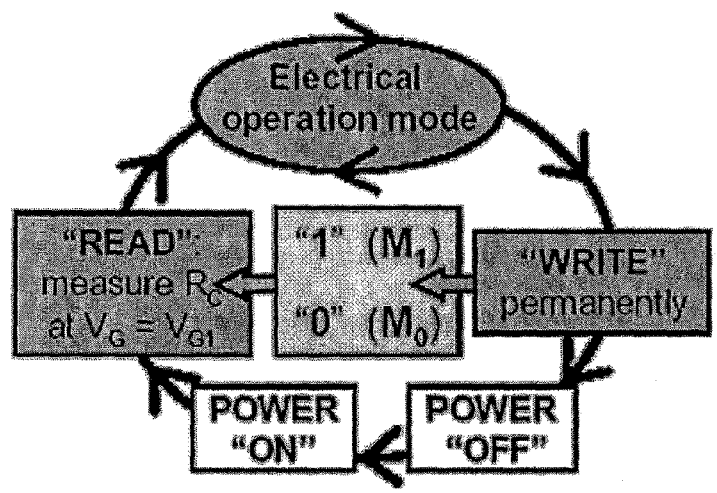
FIG. 23 illustrates a process for manipulating and storing information using the single-electron transistor shown in FIG. 1.
Figure 24:
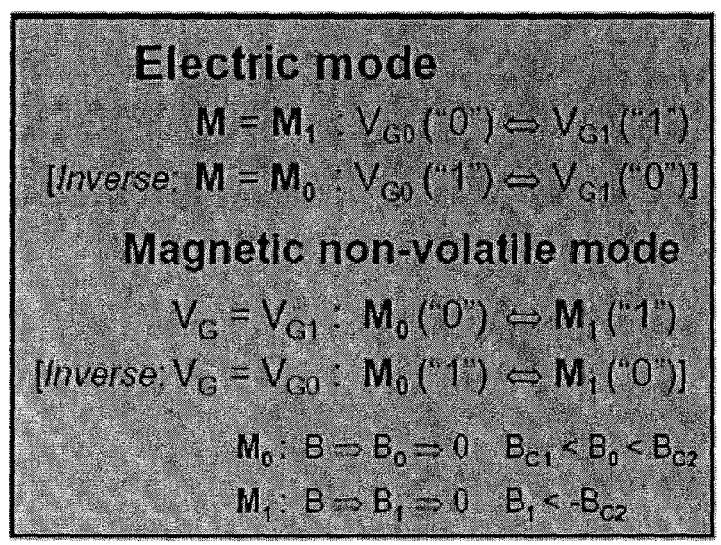
FIG. 24 is a state table.

Referring to FIGS. 23 and 24, a process for manipulating and storing information using the single-electron transistor 1 is shown. FIG. 24 shows a table with instructions for manipulating states. At $V_{G0}$, the system is in the low-resistance ("1") state if the magnetization $M=M_1$, but in the high-resistance state if $M=M_0$. At $V_{G1}$, the opposite relation applies. Thus, the transistor characteristics can be inverted.

Other Devices

In the single-electron transistor 1 described earlier, the chemical potentials of the gate 2, leads 8, 9 and islands 10 depend on their respective magnetization orientations. The chemical potentials differ relative to one another to such a degree that the difference is of the order of the charging energy of the island and of the order or larger than $k_B T$.

However, it is not necessary that each region 2, 8, 9, 10 or element of the transistor 1 be ferromagnetic. For example, only one or more of these regions 2, 8, 9, 10 need be ferromagnetic.

Furthermore, lead(s) and island(s) can be formed from the same ferromagnetic material, but the magnetization may be fixed and/or stabilized along a given direction, for example by shape anisotropy or exchange coupled structures, for some of these regions such as for one or more of the leads.

—Generic Device—

Figure 25:
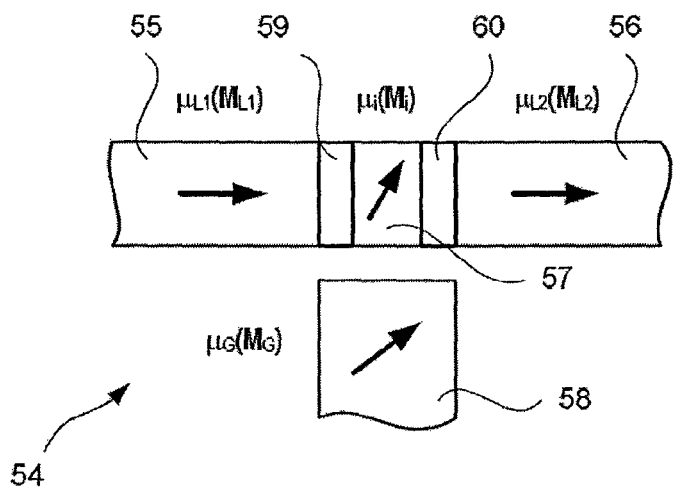
FIG. 25 is a schematic diagram of a generic device in accordance with certain embodiments of the present invention.

Referring to FIG. 25, a device 54 in accordance with certain embodiments of the present invention comprises first and second conductive leads 55, 56, at least one island 57 and, optionally, at least one gate 58. At least one part 55, 56, 57, 58 of the device 54 comprises ferromagnetic material and the magnetization orientation of at least one can be changed by external magnetic field or a gate 58. In this example, all conductive parts 55, 56, 57, 58 of the device 54 are ferromagnetic and have magnetisations $M_{L1}$, $M_{L2}$, $M_i$, $M_G$. Thus, chemical potentials $\square_{L1}$, $\square_{L2}$, $\square_i$, $\square_G$ of the conductive parts 55, 56, 57, 58 depend upon magnetisations $M_{L1}$, $M_{L2}$, $M_i$, $M_G$, i.e. $\square_{L1}(M_L)$, $\square_{L2}(M_{L2})$, $\square_i(M_i)$, $\square_G(M_G)$.

For simplicity, only one island 57 is shown and described. However, the device 54 may include more than one island, for example in a multiple tunnel junction (MTJ) arrangement, similar to that described in EP-A-0674798.

The island 57 is weakly coupled to the leads 55, 56 via tunnel barriers 59, 60. The tunnel barriers 59, 60 each have a resistance which is larger than the inverse of the quantum conductance $2e^2/h$ (where h is the Planck's constant) of about 13 kΩ for localising electrons.

To operate at a given temperature T, the charging energy $e^2/2C_{ISLAND}$ of the island is larger than thermal energy $k_b T$ (where $k_b$ is Boltzmann's constant). Thus, to operate at 77° K (i.e. the boiling point of liquid nitrogen) or at around 293° K (i.e. room temperature), the island capacitance $C_{ISLAND}$ is less than about 12 aF and 3 aF respectively.

The relative change of chemical potential between different parts 55, 56, 57, 58 of the device 54 before and after magnetization re-orientation is of the order of the charging energy, for example about 6 meV and 25 meV for 77° K and 293° K.

The device 54 may be fabricated, for example from an epilayer of ferromagnetic semiconductor in a similar way to single-electron transistor 1 described earlier or from successively-evaporated layers of ferromagnetic material in a similar way to that described in "Enhanced Magnetic Valve Effect and Magneto-Coulomb Oscillations in Ferro Magnetic Single Electron Transistor" supra.

—Lateral Device—

Figure 26:
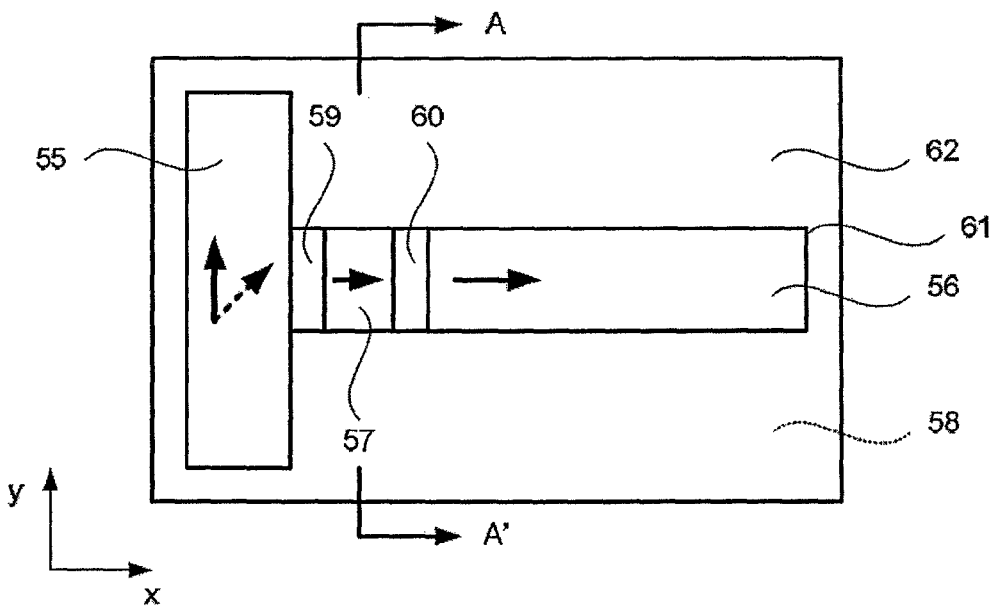
FIG. 26 shows a lateral conduction device in accordance with certain embodiments of the present invention.
Figure 27:
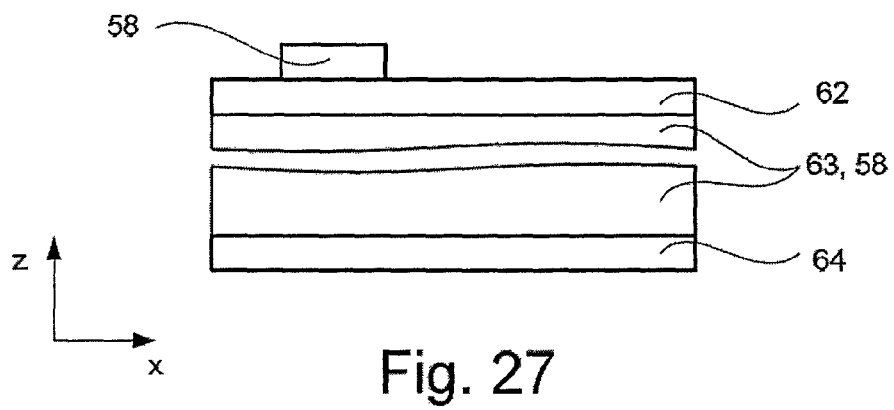
FIG. 27 is a cross-section of the device shown in FIG. 26 taken along the line A-A'.
Figure 28:
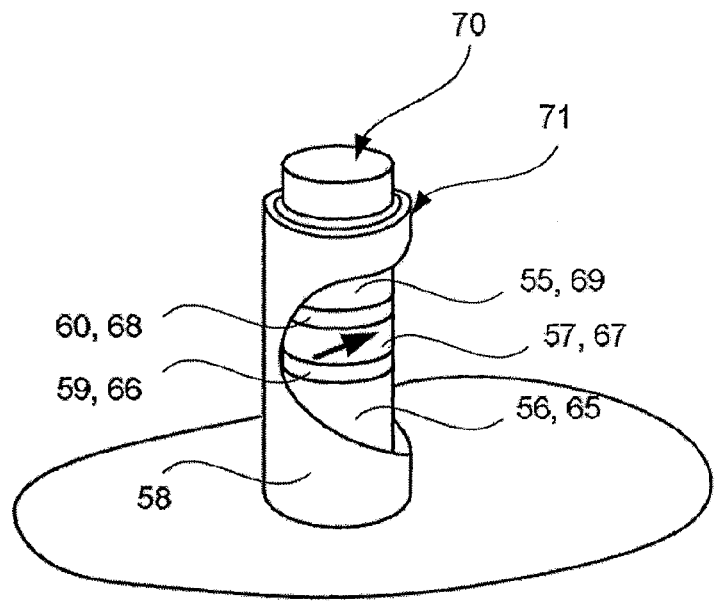
FIG. 28 illustrates a vertical conduction device in accordance with certain embodiments of the present invention.

Referring to FIGS. 26 and 27, the device 54 may be formed in a single layer 61 of ferromagnetic material showing strong magnetic anisotropy. The layer 61 is grown on a layer 62 of insulating material on a conductive substrate 63 which provides a (back) gate 58 and controlled via contact 64. The ferromagnetic material layer 61 may be formed of (Ga,Mn)As and may have a thickness of 5 nm. The insulating layer 62 may be AlAs and may have a thickness of 20 nm. The conductive substrate 63 may be n-GaAs.

The island 57 may be defined by patterning narrow barriers by locally oxidizing the ferromagnetic material layer 61 using a scanning tunnelling microscope (STM) or atomic force microscope (AFM), for example as described in "Room temperature operation of a single electron transistor made by the scanning tunneling microscope nanooxidation process for the $TiO_x/Ti$ system" supra., by dry etching using a focused ion beam (FIB) or by etching using direct contact lithography and (wet or dry) etching.

Shape anisotropy is used to force the magnetization of the island 57 and lead 56 along x-direction and the magnetization of lead 55 along y- or −y-direction. Applying an external magnetic field $B_{EXT}$ allows, for example the magnetisation $M_i$ of the island 57 to align along the direction of $B_{EXT}$.

Alternatively, the device 54 may be arranged such that a magnetization $M_{L1}$, $M_{L2}$ in one of the leads 55, 56 rotates with respect to the magnetization $M_{L1}$, $M_{L2}$, $M_i$ of the other lead 55, 56 and the island 57.

—Vertical Device—

Referring to FIGS. 26 and 27, the device 54 may be formed using plural overlying layers 65, 66, 67, 68, 69 and arranged as a pillar 70 with an annular gate arrangement 71. The pillar 70 has a diameter less than 50 nm and may be defined by electron-beam lithography and anisotropic dry etching.

The leads 55, 56 may be formed from non-ferromagnetic material, such as GaAs, the tunnel barriers 59, 60 may be formed from an insulating material, such as AlAs or AlGaAs, and the island(s) 57 may be formed from a ferromagnetic material, such as (Ga,Mn)As.

Alternatively, the leads 55, 56 may be formed from ferromagnetic material, such as GaAs, the tunnel barriers 59, 60 may be formed from an insulating material, such as AlAs or AlGaAs, and the island(s) 57 may be formed from a ferromagnetic material, such as (Ga,Mn)As, on non-ferromagnetic material, such as InGaAs.

The annular gate arrangement 71 comprises a concentric inner insulating layer 72 and a concentric outer gate 58. The insulating layer 72 may be formed from AlAs and the gate 58 may be formed from (ferromagnetic) GaMnAs or (non-ferromagnetic) GaAs, for example grown by MBE. Alternatively, the insulating layer 72 may be formed from $Si_3N_4$ deposited by CVD or sputtering and the gate 58 may be formed from (ferromagnetic) FePt or (non-ferromagnetic) Al deposited by sputtering or thermal evaporation.

Figure 29:
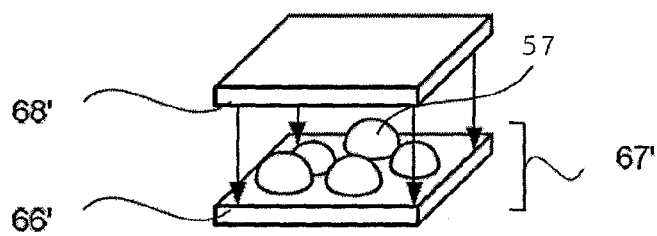
FIG. 29 shows self-assembled islands.

Referring to FIG. 29, the island(s) 57 may be self-assembled by growing a thin layer 67' of semiconducting material, such as InGaAs, by molecular beam epitaxy (MBE) in Stranski-Krastanov growth mode on a first insulting material layer 66', then growing the second insulting material layer 67'. Thus, the island(s) 57 are embedded within insulating material.

As explained earlier, the leads 55, 56 and/or the island(s) 57 may be ferromagnetic. The thermal stability of the island magnetization is not necessarily required if an external magnetic field $B_{EXT}$ stabilizes the island magnetization along its direction. The external magnetic field $B_{EXT}$ maybe a field which is being sensed.

Figure 30:
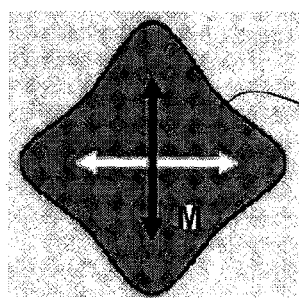
FIG. 30 illustrates shape anisotropy.

Referring to FIG. 30, shape anisotropy can arise from the interaction between the magnetic moments of a magnetic layer and a demagnetizing field, generated by the magnetic moments themselves. Therefore, the shape anisotropy favours an in-plane orientation of the magnetization M and depends also on the surrounding shape 72 of the ferromagnetic layer.

Figure 31:
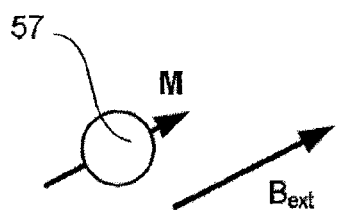
FIG. 31 illustrates stabilization of magnetization of a ferromagnetic region in an external field.

Referring to FIG. 31, a magnetic field sensitive ferromagnetic region, such as the island 57, might be so small that the magnetization at zero-applied magnetic field $H_{EXT}=0$ becomes thermally unstable. Notwithstanding this, a sensed external field can stabilize its magnetization via the Zeeman effect along the field direction. The corresponding Zeeman energy $E_Z \sim M_S H_{EXT} V_{FM}$ is of the order of 1 meV/Oe for typical metal ferromagnets with saturation magnetization $M_S$ of the order of $10^3$ emu/cm$^3$ and by assuming a volume of the ferromagnetic region of $(10 \times 10 \times 5)$ nm$^3$.

—Ferromagnetic Materials—

In some embodiments of the present invention, ferromagnetic regions may be formed from a dilute magnetic semiconductor (DMS). However, the ferromagnetic regions may be formed from ferromagnetic metals and alloys.

Some ferromagnetic materials, such as FePt, CoPt and CoPd, ordered alloys, provide strong spin-orbit coupling. In these systems, the transition metal produces large exchange splitting resulting in the Curie temperatures well above room temperature, while the heavy elements of Pt substantially increase the strength of spin-orbit coupling in the band structure of the alloy. Calculated chemical potential anisotropies for FePt and CoPt are shown in FIG. 11.

Other ferromagnetic materials may be used such as alloys including rare earth metals with occupied $4f$ electron-levels, such as Dy, Er and Ho.

—Hard Disk Head—

Figure 32:
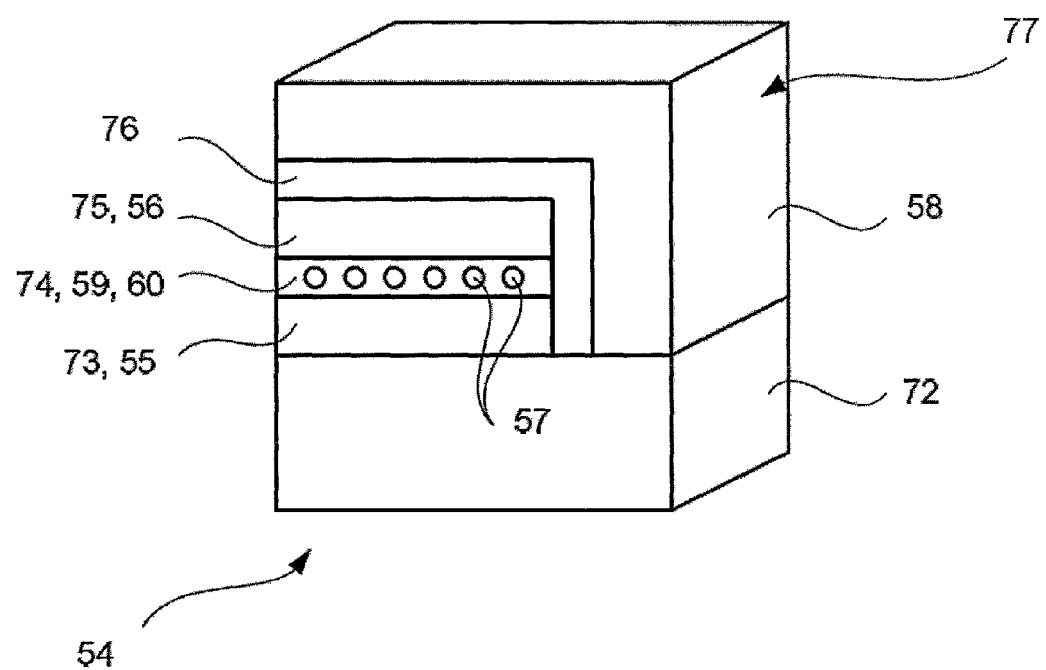
FIG. 32 illustrates a head in accordance with certain embodiments of the present invention.

Referring to FIG. 32, the device 54 may be formed using plural overlying layers 72, 73, 74, 75, 76 and having a combined top and side gate arrangement 77.

The first and second conducting layers 73, 75 provide leads 55, 56 and may be formed from non-ferromagnetic conductive material, such as W or Ti. An insulating layer 73, sandwiched between the conducting layers 73, 75, includes ferromagnetic conducting islands 57 and provides tunnel barriers 59, 60. The insulating layer 73 may be formed from $Si_3N_4$ or $SiO_2$ and the conducting islands 57 may be formed from ferromagnetic material, such as CoPt or FePd. The ferromagnetic conducting islands 57 have a diameter, d, of the order of 1 nm, for example between 2 and 5 nm. The insulating layer 73 has a thickness t, for example, such that tunnel barriers 59, 60 have a thickness, s, of the between 3 and 7 nm for $Si_3N_4$ and 1 and 4 nm $SiO_2$, where s=0.5(t–d). The first and second conducting layers 73, 75 have a thickness of the order of 10 nm.

The gate 58 is formed of non-ferromagnetic conductive material, such as W or Ti, and is isolated by a gate insulator 76, such as $Si_3N_4$ or $SiO_2$. The device 54 is formed on substrate 72 of silicon or quartz.

Devices according to certain embodiments of the present invention can provide combined spintronic and single-electronic functionality, which can allow the devices to operate as a transistor and/or as a non-volatile memory.

A three-terminal device according to certain embodiments of the present invention can operate with transistor characteristics corresponding to a n-channel and/or a p-channel field effect transistor. Switching between n-channel and p-channel characteristics is achieved by operating the device in its "magnetic mode" which can be realized by applying either a magnetic field or an electric field.

Furthermore, combined functionalities allow the simple realization of logic functions, such as controlled NOT operation.

Devices according to certain embodiments of the present invention can provide signal amplification without any additional transistors. Therefore, non-volatile memory can be realised with fewer additional electronic components.

Devices according to certain embodiments of the present invention can consume little power since transport is based on single electrons.

Devices according to certain embodiments of the present invention can exhibit thermal stability since the ferromagnetic regions of the device can be provided using larger parts of the devices, such as leads and gates. This can help to ameliorate thermal instability arising from superparamagnetic limitation and magnetic noise, which may be problematic for MRAM and HDD sensor applications as devices are scaled down.

Unlike conventional GMR- and TMR-devices where the relative orientation between two ferromagnetic regions define the resistance state of the device, devices according to certain embodiments of the present invention can operate (in a "magnetic mode") by reorienting magnetization of the magnetic region(s) solely with respect to their crystalline orientation and/or current direction. Thus, the state of the device operated in a "magnetic mode" can therefore be defined by the magnetization orientation of a single magnetic region. The use of an additional "pinned layer", necessary in conventional GMR- and TMR-devices to provide thermal stability, is not required.

For sensors according to certain embodiments of the present invention, even though the magnetic field sensitive ferromagnetic region may be so small that the magnetization at zero-applied magnetic field $H_{EXT}=0$ becomes thermally unstable, a sensed external field can stabilize the magnetization via the Zeeman effect along the field direction.

If a sensor according to certain embodiments of the present invention is operated in a magnetic mode, it can have ultra-high magneto-sensitivity.

Devices according to certain embodiments of the present invention can exhibit non-volatile memory function using electrical field induced magnetization reversal.

Devices according to certain embodiments of the present invention can have a simple device structure in which parts of the device, such as gate, leads and island(s), can be made from a single patterned material layer. Furthermore, the sizes of the devices can be scaled.

It will be appreciated that many modifications may be made to the embodiments hereinbefore described. For example, the ferromagnetic layer may have a different thickness, for example between 5 and 20 nm. Ferromagnetic regions may be placed in close proximity to non-ferromagnetic regions so that non-ferromagnetic regions become also polarized with respect to the magnetization orientation of the ferromagnetic regions. Devices may operate based on electron or hole transfer. A capping layer may be used to protect the GaMnAs layer.

The invention claimed is:

1. A magnetoresistance single-charge tunnelling device comprising:

first and second leads;

a conductive island having a charging energy of at least 1 meV and arranged such that charge is transferable from the first lead to the second lead via the conductive island; and a gate for changing an electrostatic energy of the conductive island; and wherein at least one of said first lead, second lead, island and the gate comprises a ferromagnetic material which exhibits strong spin-orbit coupling such that the at least one of the said first lead, second lead, island and the gate exhibits a change in chemical potential of at least an order of the charging energy in response to rotation of magnetization from a first orientation to a second orientation which is not parallel or anti-parallel to the first orientation, wherein neither the first and second leads provide a pinned region; and wherein the single-charge tunneling device exhibits an anisotropic magnetoresistance effect and not a tunneling magnetoresistance effect wherein the first lead, the second lead and the island each comprise the same ferromagnetic material.

2. A device according to claim 1, wherein the gate comprises the same ferromagnetic material.

3. A device according to claim 1, wherein the first lead, the second lead and the island are formed in a layer of the ferromagnetic material.

4. A device according to claim 3, wherein the first lead, second lead, the island and the gate are formed in a layer of the ferromagnetic material.

5. A device according to claim 3, wherein the layer has a constriction and the conductive island is formed within the constriction.

6. A device according to claim 1, wherein shapes of the first lead, the second lead and the island are arranged such that magnetization of at least one of the first lead, second lead and island is forced along a direction transverse to magnetization of remaining ones of the first lead, second lead and island or is forced along a different direction which is not parallel or anti-parallel from the other direction for which the chemical potentials are different.

7. A device according to claim 1, comprising at least two islands arranged such that charge is transferable from the first lead to the second lead via at least one of the at least two conductive islands.

8. A device according to claim 1, wherein at least two of the first lead, second lead, island and gate comprises a ferromagnetic material and there is a net change in chemical potential in response to a change in direction of magnetization of at least one of the at least two of the first lead, second lead and island.

9. A device according claim 1, wherein the change in chemical potential is at least 6 meV or at least 9 meV.

10. A device according to claim 1, wherein said ferromagnetic material is GaMnAs.

11. A device according to claim 1, wherein said ferromagnetic material is Ga0.98Mn0.02As.

12. A device according to claim 1, wherein said ferromagnetic material comprises an alloy which includes a rare earth metal.

13. A device according to claim 12, wherein said rare earth metal is Dy, Er or Ho.

14. A device according to claim 1, wherein said ferromagnetic material comprises an alloy which includes a transition or noble metal.

15. A non-volatile memory comprising a device according to claim 1.

16. A magnetic field sensor comprising a device according to claim 1.

17. A magnetoresistance single-charge tunnelling device comprising:

first and second leads; and a conductive island having a charging energy of at least 1 meV and arranged such that charge is transferable from the first lead to the second lead via the conductive island; and wherein at least one of the first lead, second lead and island comprises a ferromagnetic material which exhibits strong spin-orbit coupling such that the at least one of the said first lead, second lead and island exhibits a change in chemical potential of at least an order of the charging energy in response to rotation of magnetization from a first orientation to a second orientation which is not parallel or anti-parallel to the first orientation; wherein neither the first and second leads provide a pinned region; and wherein the single-charge tunneling device exhibits an anisotropic magnetoresistance effect and not a tunneling magnetoresistance effect wherein the first lead, the second lead and the island each comprise the same ferromagnetic material.

18. A magnetoresistance device comprising:

first and second leads;

first and second tunnel barriers; and a conductive island having a charging energy of at least 1 meV and arranged such that charge is transferable from the first lead to the second lead via the first tunnel barrier, the conductive island and the second tunnel barrier; and wherein at least one of the first lead, second lead and island comprises a ferromagnetic material which exhibits strong spin-orbit coupling such that the at least one of the said first lead, second lead and island exhibits a change in chemical potential of at least an order of the charging energy in response to rotation of magnetization from a first orientation to a second orientation which is not parallel or anti-parallel to the first orientation, wherein neither the first and second leads provide a pinned region and wherein the device exhibits an anisotropic magnetoresistance effect and not a tunneling magnetoresistance effect wherein the first lead, the second lead and the island each comprise the same ferromagnetic material.

19. A method of operating a single-charge tunnelling device comprising first and second leads, a conductive island having a charging energy of at least 1 meV and arranged such that charge is transferable from the first lead to the second lead via the conductive island and a gate for changing an electrostatic energy of the conductive island, at least one of said first lead, second lead, island and the gate comprises a ferromagnetic material which exhibits strong spin-orbit coupling such that the at least one of the said first lead, second lead, island and the gate exhibits a change in chemical potential of at least an order of the charging energy in response to rotation of magnetization from a first orientation to a second orientation which is not parallel or anti-parallel to the first orientation, wherein neither the first and second leads provide a pinned region and wherein the single-charge tunneling device exhibits an anisotropic magnetoresistance effect and not a tunneling magnetoresistance effect wherein the first lead, the second lead and the island each comprise the same ferromagnetic material, the method comprising:

applying a first bias to the gate;

removing said first bias from the gate;

measuring a first resistance between the leads;

applying a second, different bias to the gate;

removing said second bias from the gate; and measuring a second resistance between the leads such that the first and second resistances differ.

20. A method of operating a single-charge tunnelling device comprising first and second leads, a conductive island having a charging energy of at least 1 meV and arranged such that charge is transferable from the first lead to the second lead via the conductive island, at least one of said first lead, second lead and island comprises a ferromagnetic material which exhibits strong spin-orbit coupling such that the at least one of said first lead, second lead, island and the gate exhibits a change in chemical potential of at least an order of the charging energy in response to rotation of magnetization from a first orientation to a second orientation which is not parallel or anti-parallel to the first orientation, neither the first and second leads provide a pair of free and pinned regions and wherein the single-charge tunneling device exhibits an anisotropic magnetoresistance effect and not a tunneling magnetoresistance effect wherein the first lead, the second lead and the island each comprise the same ferromagnetic material, the method comprising:
- applying a first magnetic field;
- removing the first magnetic field;
- measuring a first resistance between the leads;
- applying a second, different magnetic field;
- removing the second magnetic field; and
- measuring a second resistance between the leads such that the first and second resistances differ.

21. Apparatus according to claim 1, further comprising a magnetic field source which is configured to apply a magnetic field to the single-charge tunneling device such that magnetization is rotated from a first orientation to a second orientation which is not parallel or anti-parallel to the first orientation.

22. Apparatus according to claim 17, further comprising a magnetic field source which is configured to apply a magnetic field to the single-charge tunneling device such that magnetization is rotated from a first orientation to a second orientation which is not parallel or anti-parallel to the first orientation.

23. Apparatus according to claim 18, further comprising a magnetic field source which is configured to apply a magnetic field to the single-charge tunneling device such that magnetization is rotated from a first orientation to a second orientation which is not parallel or anti-parallel to the first orientation.

24. A method according to claim 19, wherein applying the first bias causes magnetization to be rotated from the first orientation to the second orientation and applying the second bias causes magnetization to be rotated from the second orientation to a third orientation which is not parallel or anti-parallel to the first orientation.

25. A method according to claim 20, wherein applying the first magnetic field causes magnetization to be rotated from the first orientation to the second orientation and applying the second magnetic field causes magnetization to be rotated from the second orientation to a third orientation which is not parallel or anti-parallel to the first orientation.

* * * * *